United States Patent
Nariman (10) Patent No.: US 6,791,697 B1
(45) Date of Patent: Sep. 14, 2004

(54) SCATTEROMETRY STRUCTURE WITH EMBEDDED RING OSCILLATOR, AND METHODS OF USING SAME

(75) Inventor: Homi E. Nariman, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 93 days.

(21) Appl. No.: 10/104,675

(22) Filed: Mar. 21, 2002

(51) Int. Cl.$^7$ .............................................. G01B 11/14
(52) U.S. Cl. ......................... 356/603; 356/629; 331/44
(58) Field of Search ........................ 438/14–18; 331/57, 331/44, 64; 356/600–608, 625–629, 392, 394, 610–613

(56) References Cited

U.S. PATENT DOCUMENTS

| | | | |
|---|---|---|---|
| 5,867,276 A | 2/1999 | McNeil et al. | 356/445 |
| 5,877,860 A | 3/1999 | Borden | 356/613 |
| 5,880,838 A | 3/1999 | Marx et al. | 356/613 |
| 5,963,329 A | 10/1999 | Conrad et al. | 356/372 |
| 5,994,969 A | 11/1999 | Bujanos | 331/57 |
| 6,051,348 A | 4/2000 | Marinaro et al. | 430/30 |
| 6,075,417 A | 6/2000 | Cheek et al. | 331/44 |
| 6,081,334 A | 6/2000 | Grimbergen et al. | 356/499 |
| 6,100,985 A * | 8/2000 | Scheiner et al. | 356/630 |
| 6,137,433 A * | 10/2000 | Zavorotny et al. | 342/26 |
| 6,216,099 B1 | 4/2001 | Fang et al. | 703/15 |
| 6,245,584 B1 | 6/2001 | Marinaro et al. | 438/14 |
| 6,259,521 B1 | 7/2001 | Miller et al. | 356/237.5 |
| 6,383,824 B1 * | 5/2002 | Lensing | 438/14 |
| 6,433,871 B1 * | 8/2002 | Lensing et al. | 356/450 |
| 6,433,878 B1 | 8/2002 | Niu et al. | 356/603 |
| 6,556,303 B1 * | 4/2003 | Rangarajan et al. | 356/446 |
| 2002/0135781 A1 | 9/2002 | Singh et al. | 356/601 |

* cited by examiner

*Primary Examiner*—Minh Nguyen
(74) *Attorney, Agent, or Firm*—Williams, Morgan & Amerson, P.C.

(57) ABSTRACT

In one illustrative embodiment, the method involves forming a ring oscillator that includes a first grating structure comprised of a plurality of gate electrode structures for a plurality of N-channel transistors and a second grating structure comprised of a plurality of gate electrode structures for a plurality of P-channel transistors, and measuring the critical dimension and/or profile of at least one of the gate electrode structures in the first grating structure and/or the second grating structure using a scatterometry tool. In another embodiment, the method further involves forming at least one capacitance loading structure, comprised of a plurality of features, as a portion of the ring oscillator, and measuring the critical dimension and/or profile of at least one of the features of the capacitance loading structure using a scatterometry tool.

45 Claims, 5 Drawing Sheets

(Prior Art)

SCATTEROMETRY STRUCTURE WITH EMBEDDED RING OSCILLATOR, AND METHODS OF USING SAME

BACKGROUND OF THE INVENTION

1. Field of the Invention

This invention relates generally to semiconductor fabrication technology, and, more particularly, to a scatterometry structure with an embedded ring oscillator, and various methods of using same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Given the importance of device performance, integrated circuit manufacturers expend a great deal of time and effort trying to maintain and improve device capabilities. Such efforts typically involve conducting a variety of electrical tests on the completed integrated circuit devices. Such tests may measure a variety of electrical parameters of the resulting device, e.g., operating frequency, drive current, resistivity, etc. Integrated circuit manufacturers constantly try to improve the design of the device or the manufacturing processes used to form such devices based upon an analysis of this electrical test data.

Figure 1A:
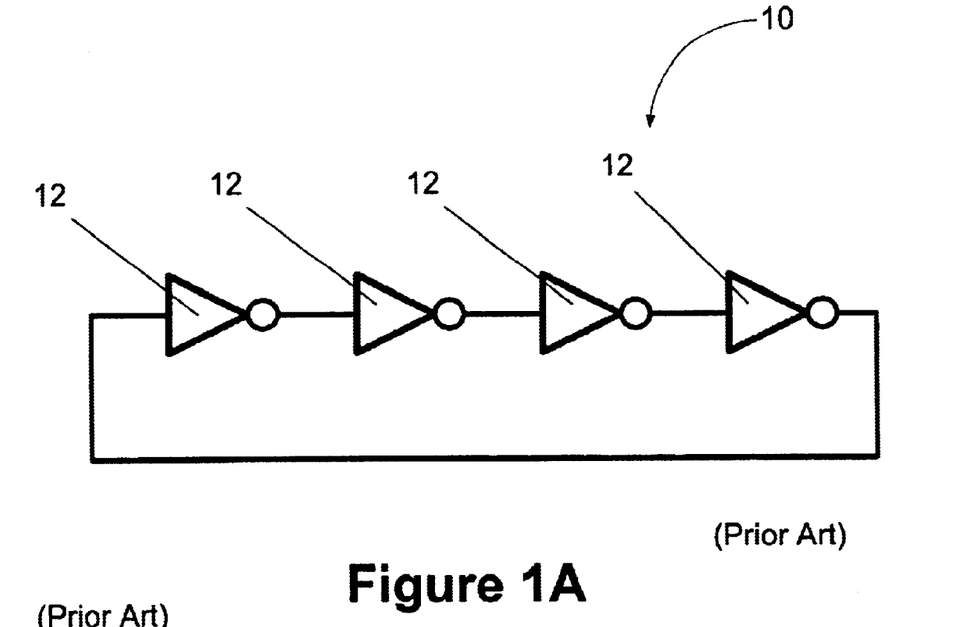
FIGS. 1A–1B are schematic views of an illustrative prior art ring oscillator.

With respect to some integrated circuit products, e.g., microprocessors, a ring oscillator is typically employed to evaluate the operating speed of the integrated circuit device. An illustrative ring oscillator 10 is schematically depicted in FIG. 1A. As shown therein, the ring oscillator 10 is typically comprised of a plurality of inverters 12 arranged in a series, with the output of an upstream inverter 12 being coupled to the input of a down-stream inverter 12. The number of inverters 12 in a given ring oscillator 10 may vary depending upon the product being manufactured. For example, there may be 53 or 101 inverters 12 in an illustrative ring oscillator 10.

Figure 1B:
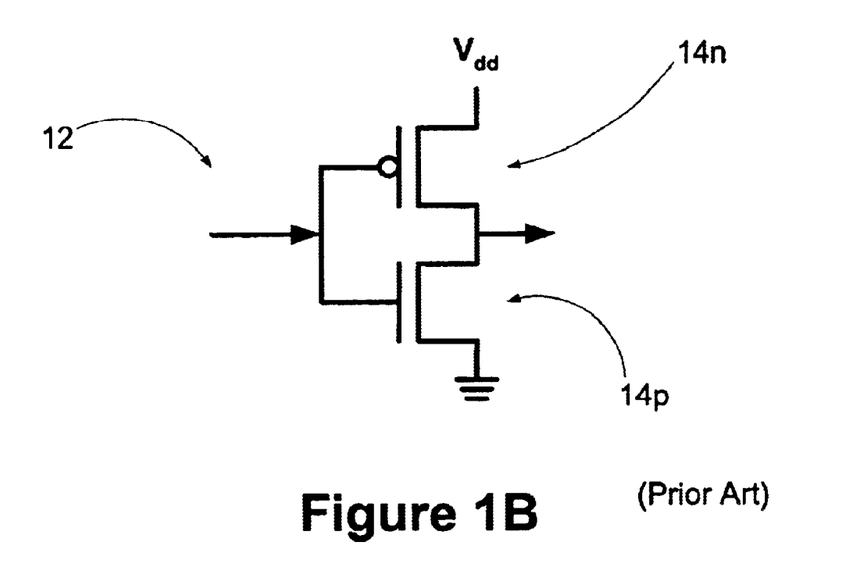

FIG. 1B is a more detailed schematic diagram of an illustrative inverter 12. As shown therein, each inverter 12 is typically comprised of a P-channel transistor 14P and an N-channel transistor 14N. Ultimately, a variety of electrical tests may be performed on the ring oscillator 10 after its construction is complete to determine the performance characteristics of the resulting integrated circuit devices. However, such test results are not available until after the ring oscillator 10 and other integrated circuits have been substantially manufactured. That is, the electrical test data is not available for analysis and feedback as rapidly as would otherwise be desired.

Efforts have been made to measure the critical dimension of the gate electrode structures (not shown) of one or more of the transistors (P-type and/or N-type) that comprise the inverters 12 of the ring oscillator 10 in an effort to predict device performance. Typically, these critical dimension ("CD") measurements are made using a scanning electron microscope (SEM) or other such metrology tool. However, due to continual reductions in size, the critical dimension of gate electrode structures can, in some cases, be difficult to determine through use of existing SEM metrology tools. This will become more problematic as gate electrode critical dimensions continue to decrease in the future. Moreover, given the close proximity of the millions of gate electrode structures formed above a substrate, and the inherent nature of the SEM, the data obtained by the SEM does not provide information about the entire profile of the gate electrode structure. That is, due to excessive noise and interference, the SEM can only be used to see down to about the mid-thickness level of the gate electrode. Thus, the profile of the gate electrode near the surface of the substrate may not be readily examined using existing SEM metrology tools. As a result, important information may be lost as to the critical dimension and/or profile of the gate electrode structures and the resulting impact on device performance levels.

The present invention is directed to a ring oscillator structure and various methods of using such a structure that may solve, or at least reduce, some or all of the aforementioned problems.

SUMMARY OF THE INVENTION

The present invention is generally directed to a scatterometry structure with an embedded ring oscillator, and various methods of using same. In one illustrative embodiment, the method comprises forming a ring oscillator that comprises a first grating structure comprised of a plurality of gate electrode structures for a plurality of N-channel transistors and a second grating structure comprised of a plurality of gate electrode structures for a plurality of P-channel transistors, and measuring at least one of a critical dimension and a profile of at least one of the gate electrode structures in at least one of the first grating structure and the second structure using a scatterometry tool. In a further embodiment, the method further comprises comparing the measured critical dimension and/or profile of the gate electrode structures to a model to predict at least one electrical performance characteristic of the ring oscillator, wherein the model provides a correlation between the critical dimension and/or profile of a gate electrode structure to at least one electrical performance characteristic of the ring oscillator.

In another embodiment, the method further comprises forming at least one capacitance loading structure, comprised of a plurality of features, as a portion of the ring oscillator, and measuring the critical dimension and/or profile of at least one of the features comprising the capacitance loading structure using a scatterometry tool. In further embodiments, the method further comprises comparing the measured critical dimension and/or profile of at least one of the features comprising the capacitance loading structure to a model to predict at least one electrical performance characteristic of the ring oscillator, wherein the model provides a correlation between the critical dimension and/or profile of the features comprising the capacitance loading structure to at least one electrical performance characteristic of the ring oscillator.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features or regions on fabricated devices. Nevertheless, the attached drawings are included to describe and explain illustrative examples of the present invention.

In general, the present invention is directed to a scatterometry structure with an embedded ring oscillator, and various methods of using same. As will be readily apparent to those skilled in the art upon a complete reading of the present application, the present method is applicable to a variety of technologies, e.g., NMOS, PMOS, CMOS, etc., and it is readily applicable to a variety of different types of devices.

Figure 2A:
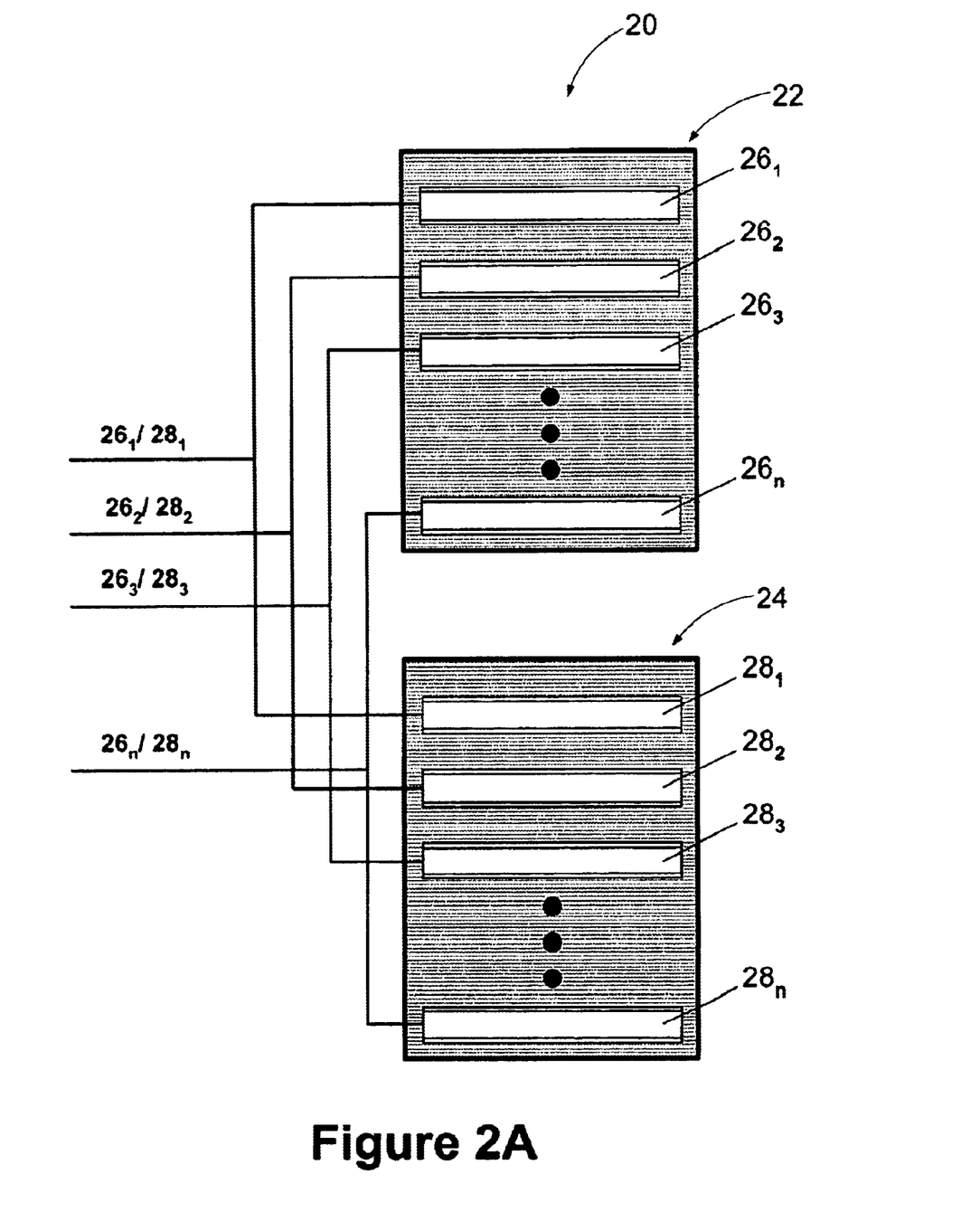
FIGS. 2A–2B are schematic views depicting various illustrative embodiments of a ring oscillator in accordance with the present invention.

FIG. 2A is a schematic representation of a ring oscillator 20 in accordance with one embodiment of the present invention. As set forth previously, a typical ring oscillator is comprised of a plurality of inverters, each of which is comprised of an N-channel transistor and a P-channel transistor. Each of the transistors has a gate electrode. In one illustrative embodiment, as shown in FIG. 2A, the gate electrode structures $26_1$–$26_n$ for the N-channel transistors of the ring oscillator 20 constitute a first grating structure 22, while the gate electrode structures $28_1$–$28_n$ for the P-channel transistors constitute a second grating structure 24. The N-channel and P-channel transistors are paired together to define an inverter, as schematically depicted in FIG. 2A. For example, when completed, the N-channel transistor $26_1$ and the P-channel transistor $28_1$ will be electrically coupled together to form one of the inverters of the ring oscillator 20. The remaining N-channel and P-channel transistors are similarly paired together. The number of transistor pairs that comprise the ring oscillator 20 may vary depending upon the product under construction, thus the use of the designation "n" for the last gate electrode structures $26_n$, $28_n$ in the first grating structure 22 and the second grating structure 24, respectively. For ease of reference, the gate electrode structures $26_1$–$26_n$, $28_1$–$28_n$ may be collectively or individually referred to by the reference numbers 26, 28, respectively.

Those skilled in the art will recognize that the lines connecting the gate electrode structures depicted in FIG. 2A are intended only to convey that the transistor pairs are electrically coupled together. The exact manner in which the transistor pairs are coupled together are well known and understood by those skilled in the art. For example, for a given pair of an N-channel and a P-channel transistors, the pair may be wired together such that the source of the P-channel device is coupled to a supply voltage ($V_{dd}$), the drain of the P-channel device is coupled to the drain of the N-channel device, and the source of the N-channel device is coupled to ground. Additionally, the input for a downstream inverter, i.e., a subsequent pair of an N-channel transistor and a P-channel transistor, is coupled to the drains of the preceding N-channel and P-channel transistors. Thus, when current is flowing through the first inverter, an input is provided to the immediately adjacent downstream inverter. These wiring details have been omitted from the drawings so as to not obscure the present invention.

The ring oscillator 20 depicted in FIG. 2A is depicted at the point where the gate electrode structures $26_1$–$26_n$, $28_1$–$28_n$ of the various N-channel and P-channel transistors have been formed. The materials of construction and the methods of how such transistors are formed are well known to those skilled in the art. For example, a typical transistor is comprised of a gate insulation layer, a gate electrode formed above the gate insulation layer, one or more sidewall spacers formed adjacent the gate electrode, and a plurality of source/drain regions formed in the substrate by performing one or more ion implant processes. As it relates to the gate electrode structure, it may be comprised of a variety of materials, e.g., a metal, polysilicon, and it may have a thickness that ranges from approximately 150–400 nm. The critical dimension of the gate electrode structures is continually decreasing due to technological advances in semiconductor manufacturing processes. Currently, such gate electrode structures may have a critical dimension that ranges from approximately 70–180 nm, and further reductions are anticipated in the future. Such gate electrode structures may be formed by a variety of techniques, e.g., by depositing a layer of material and performing one or more etching processes to define the gate electrode structure. As set forth previously, the ring oscillator 20 shown in FIG. 2A is depicted in the point of its manufacture where the gate electrode structures $26_1$–$26_n$ for the N-channel devices and the gate electrode structures $28_1$–$28_n$ for the P-channel devices have been formed using a variety of known processes. In subsequent process operations, the additional features of such transistors, such as source/drain regions, sidewall spacers, etc., will be formed.

In general, in one aspect, the present invention involves the formation of a first grating structure 22 comprised of the N-channel gate electrode structures $26_1$–$26_n$ and a second grating structure 24 comprised of the P-channel gate electrode structures $28_1$–$28_n$, and measuring the critical dimension and/or the profile of one or more of the gate electrode structures (P-channel and/or N-channel) using a scatterometry tool. In a further aspect, the present invention involves measuring the critical dimension and/or gate profile of the gate electrode structures and, based upon those measurements, predicting the electrical performance of the ring oscillator 20 and/or the completed integrated circuit device. In the latter aspect, the invention may involve comparing the measured critical dimension or profile of the gate electrode structures to a model that correlates such physical measurement data with various electrical performance test data for previously manufactured ring oscillator structures. Details of these methods will be discussed more fully later in the application.

Figure 2B:
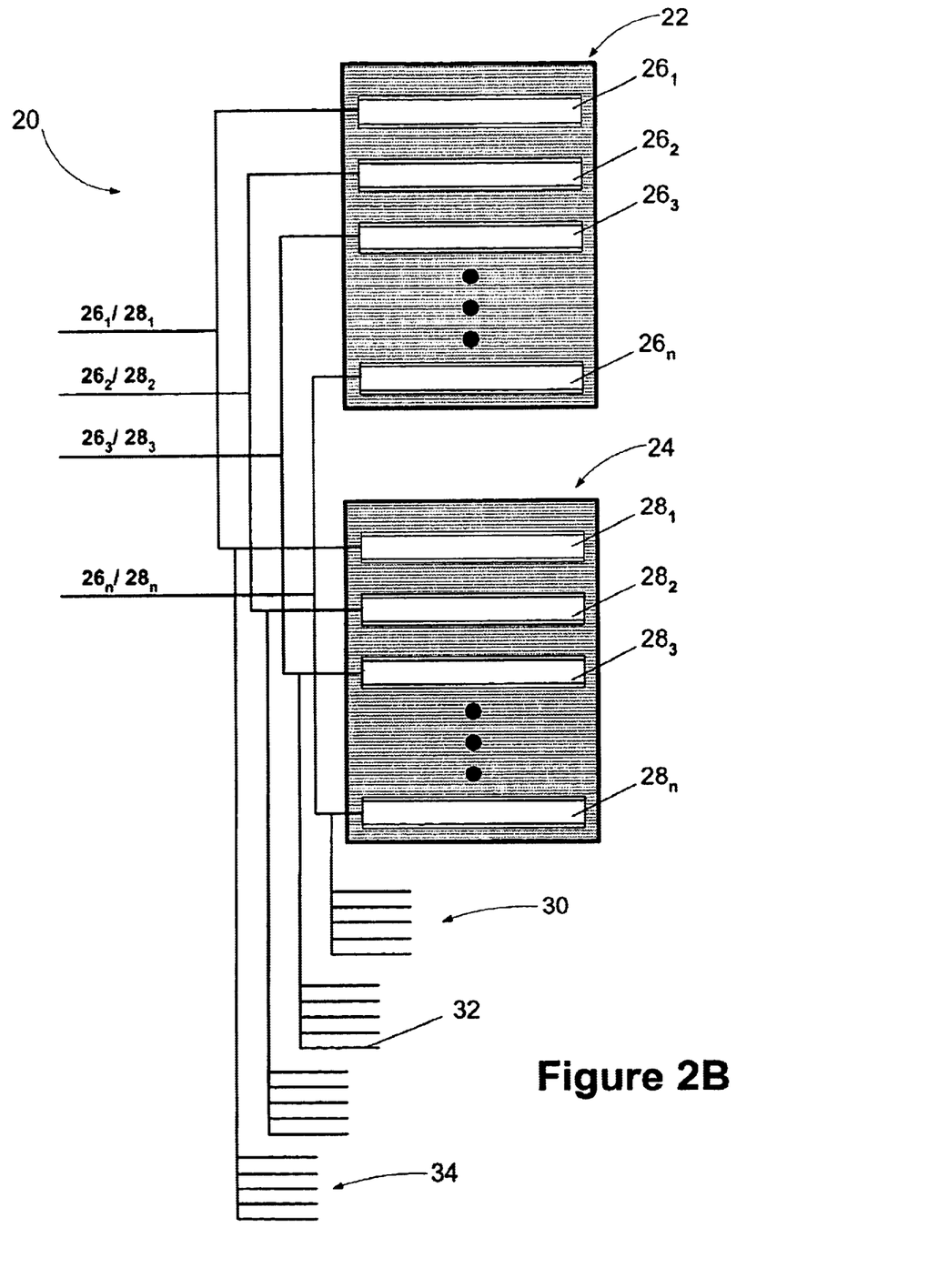

FIG. 2B is a schematic depiction of another embodiment of a ring oscillator 20 in accordance with the present invention. As shown therein, a capacitance loading structure 30 has been formed and coupled to each of the mated pairs of N-channel and P-channel transistors. In general, the capacitance loading structure 30 is intended to be representative of the capacitance loading an integrated circuit device may see in operation. The capacitance loading may be the result of a variety of factors, e.g., capacitive coupling between adjacent metal lines, etc. In short, such capacitance loading structures 30 are provided on the ring oscillator 20 to make prediction of device performance based upon testing of the ring oscillator 20 more accurate.

The capacitance loading structure 30 may be comprised of a plurality of line-type features 32, e.g., metal lines, polysilicon lines, etc. The physical size and spacing of the lines 32 will vary depending upon the desired capacitance loading to be applied to the various matched pairs of N-channel and P-channel transistors that make up an inverter of the ring oscillator 20. The capacitance loading structures 30 may also define a grating structure 34 that may be measured using a scatterometry tool. Of course, a capacitance loading structure 30 need not be coupled to every matched pair of transistors. Moreover, the capacitance loading structure 30 need not be the same for all of the matched pairs of transistors where such capacitance loading structures 30 are used. That is, the capacitance loading applied to each matched pair of transistors may vary. Additionally, the capacitance loading structures 30 may be coupled to the N-channel and/or P-channel transistors of the ring oscillator 20 in any desired manner. In the depicted embodiment, each of the capacitance loading structures 30 is coupled to the input of both the N-channel and P-channel transistors. However, if desired, the capacitance loading structures 30 may be electrically coupled to only one of the N-channel or P-channel transistors.

Figure 3A:
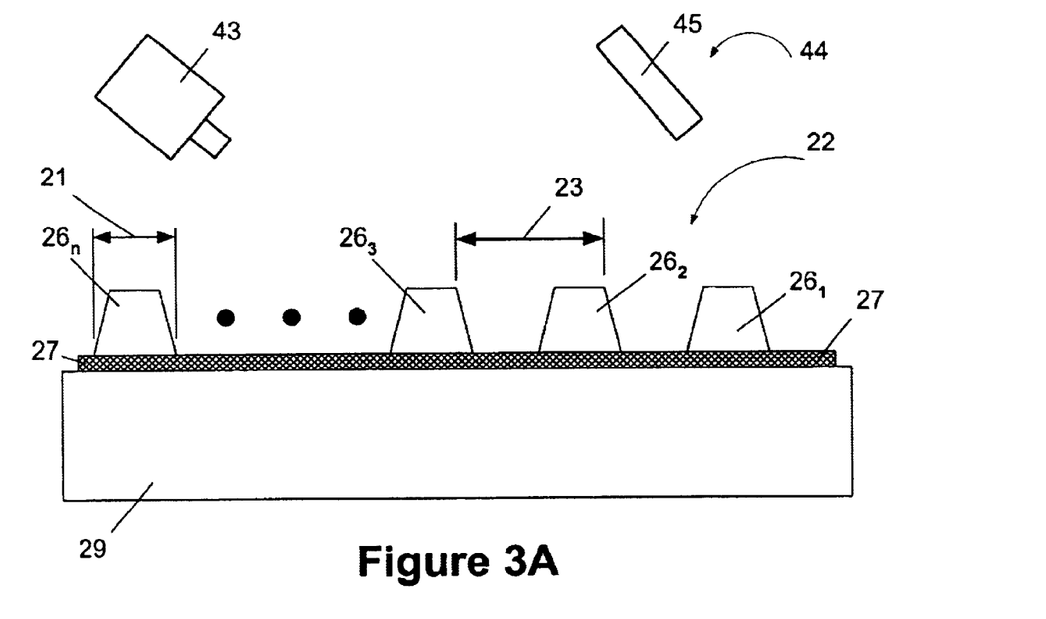
FIGS. 3A–3B depict an illustrative grating structure comprised of a plurality of gate electrode structures, and scatterometry tool illuminating such structures in accordance with one aspect of the present invention.
Figure 3B:
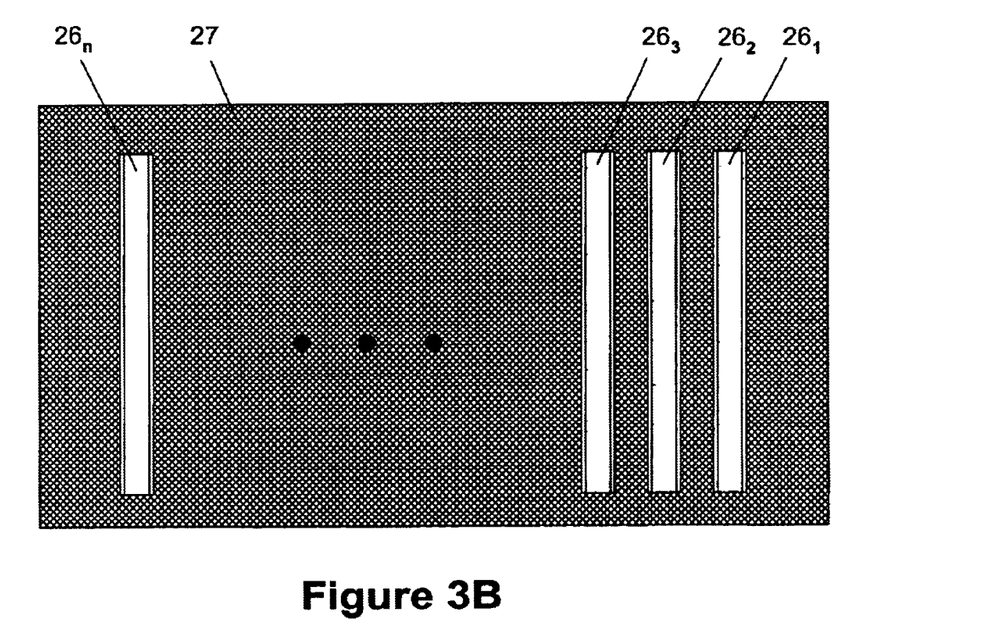

As set forth above, a scatterometry tool will be used to measure the critical dimension and/or gate profile of one or more of the gate electrode structures $26_1$–$26_n$ or $28_1$–$28_n$. FIGS. 3A–3B depict the illustrative example wherein the gate electrode structures $26_1$–$26_n$ that comprise the first grating structure 22 are subjected to measurement by a scatterometry tool 44 that is comprised of a light source 43 and a detector 45. As depicted in FIG. 3A, the first grating structure 22 is comprised of a plurality of gate electrode structures $26_1$–$26_n$ that have a critical dimension 21 and a pitch 23, both of which may vary. For example, the pitch 23 may vary between approximately 400–750 nm. Also depicted in FIG. 3A is a gate insulation layer 26 that is formed above a wafer or substrate 29. The gate electrode structures $26_1$–$26_n$ depicted in FIG. 3A have a trapezoidal-shaped cross-sectional profile. The sidewalls of the gate electrode structures $26_1$–$26_n$ have some degree of slope due to the inherent nature of the etching process used to form such gate electrode structures $26_1$–$26_n$. In some cases, the profile of the gate electrode structures $26_1$–$26_n$ is not as precise as desired. That is, the gate electrode structures $26_1$–$26_n$ may exhibit problems such as undercutting or footing, but those situations are not depicted in the attached drawings. However, such footing or undercutting may lead to device underperformance. Thus, detecting and correcting such problems is important.

The size, shape and configuration of the grating structure 22 may be varied as a matter of design choice. For example, the grating structure 22 may be formed in an area having approximate dimensions of 100 $\mu$m×120 $\mu$m, and it may be comprised of approximately 50–150 gate electrode structures 26 (depending upon the number of inverters in the ring oscillator 20). Ultimately, the grating structure 22 will be measured using scatterometric techniques, and these measurements will be used to determine the critical dimension 21 and/or the profile of the gate electrodes 26 comprising the measured grating structure 22. Moreover, the scatterometry measurements of the critical dimension 21 and/or the profile of the gate electrode structures that comprise the ring oscillator 20 may be used to predict the electrical performance characteristics of the ring oscillator 20 and/or the completed integrated circuit device.

Figure 4:
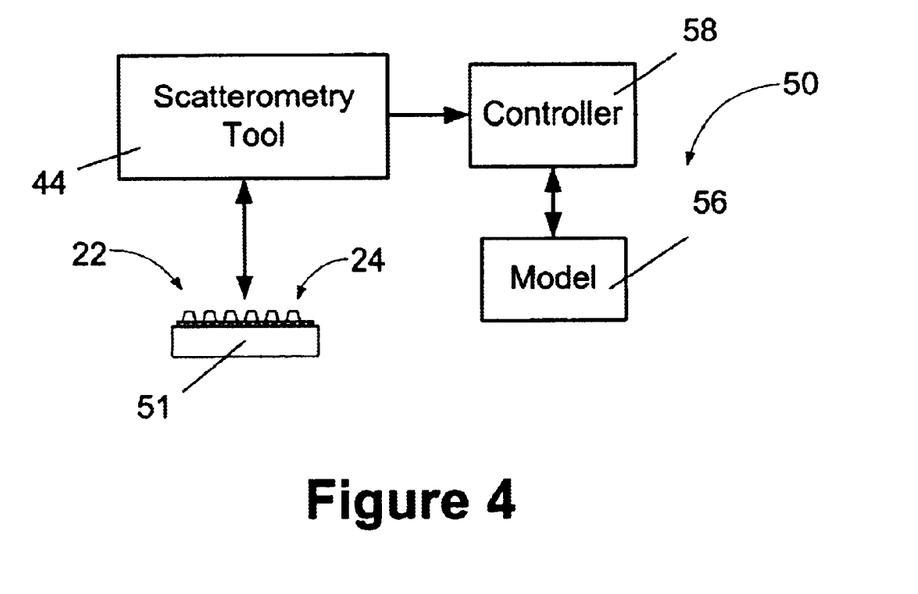
FIG. 4 depicts an illustrative embodiment of a system in accordance with one embodiment of the present invention.

An illustrative system 50 that may be used in one embodiment of the present invention is shown in FIG. 4. The system 50 is comprised of a scatterometry tool 44 and a controller 58. As indicated in FIG. 4, the wafer 51 is representative of one or more wafers at the stage of manufacture where the first and second grating structures 22, 24, comprising the gate electrode structures $26_1$–$26_n$, $28_1$–$28_n$, respectively, have been formed.

A variety of scatterometry tools 44 may be used with the present invention, e.g., so-called 2θ-type systems and lens-type scatterometry tools. The scatterometry tool 44 may use white light, or some other wavelength or combination of wavelengths, depending on the specific implementation. Typically, the scatterometry tool 44 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 44 may be based upon a comparison of light intensity to wavelength (for white light, fixed angle type scatterometry tools) or a comparison of intensity to incident angle (for angle resolved systems that use a single light source).

The details of measuring grating structures using scatterometry tools and techniques are believed to be well known to those skilled in the art. Nevertheless, a brief discussion of such measurements in the context of the present invention is provided. Through use of scatterometry, an optical characteristic trace, associated with a particular critical dimension 21 or profile of the gate electrode structures 26, 28, may be calculated (using Maxwell's equations) for a vast variety, if not all, possible critical dimension variations and profile variations readily anticipated by the design and/or manufacturing processes. These traces may be stored in a library.

Variations in the critical dimensions and/or profiles of the gate electrode structures 26, 28 will cause a significant change in the diffraction characteristics of the incident light from the light source 43 of the scatterometry tool 44. Thus, using Maxwell's equations, a unique trace may be established for each unique critical dimension and/or profile of the gate electrode structures 26, 28 anticipated by the design or manufacturing process. A library of traces corresponding to each anticipated gate electrode critical dimension and/or profile may be calculated and stored in a library. Through this technique, each trace in the library represents a grating structure comprised of gate electrode structures 26, 28 having a known critical dimension or profile. Obviously, the number of gate electrode critical dimensions and/or profiles used to create the library may vary as a matter of design choice. Moreover, the larger the number of critical dimensions and/or profiles, the larger will be the library containing such data.

The present invention may be employed to correlate or match a measured trace of a grating structure comprised of a plurality of gate electrode structures 26, 28 of a ring oscillator 20 having an unknown critical dimension and/or profile to a library of such traces, each of which corresponds to a grating structure comprised of gate electrode structures having a particular known critical dimension and/or profile. The scatterometry tool 44 may measure one or more of the grating structures 22, 24 on each die of a given wafer depending on the specific implementation. Moreover, the measured traces from a sample of the grating structures 22, 24 may be averaged or otherwise statistically analyzed. The scatterometry tool 44 (or some other controller resident within the manufacturing plant, e.g., controller 58) compares the measured trace (i.e., individual or averaged) to a library of traces with known gate electrode critical dimensions and/or profiles to correlate or approximately match the current measured trace with a trace in the library. When a match is confirmed, the scatterometry tool 44 (or other controller) may then provide data as to the critical dimension and/or profile of the gate electrode structure in the measured grating structure. For example, the scatterometry tool 44 may output data, based upon the matched trace in the library, indicating that the gate electrode structures in the measured grating structure have a certain critical dimension 21. A variety of data output criteria and format are possible. Based upon these comparisons, the previously unknown critical dimension and/or profile of the gate electrode structures comprising the measured grating structure 22, 24 may be determined.

In another embodiment, a model may be created that correlates the physical characteristics of the gate electrode structures $26_1$–$26_n$, $28_a$–$28_n$ of a ring oscillator 20 to electrical test data for the ring oscillator 20. That is, for a number of ring oscillator structures 20, the physical characteristics of the gate electrode structures $26_1$–$26_n$, $28_a$–$28_n$ that are part of the ring oscillator 20 may be measured. Thereafter, the measured ring oscillators 20 are subjected to a variety of electrical tests to determine various performance characteristics of the ring oscillator 20, e.g., operating frequency. Based upon this data, a model 56 (see FIG. 4) may be developed that correlates the measured physical features of the gate electrode structures $26_1$–$26_n$, $28_a$–$28_n$, e.g., critical dimension, profile, etc., to the resulting electrical test data. The model 56 may be developed using a variety of known analytical methods and techniques. For example, a linear fit to the electrical ring oscillator speed versus the feature critical dimension measured by scatterometric techniques. Based upon this correlation, the critical dimension and/or profile of the gate electrode structures $26_1$–$26_n$, $28_a$–$28_n$ may be measured after they are formed, but prior to completion of the ring oscillator 20, and that physical measurement data may be used to predict the performance characteristics of the ring oscillator 20 itself. That is, the present invention allows prediction of device performance relatively early in the manufacturing process by measurement of certain physical characteristics of the ring oscillator 20 gate electrode structures $26_1$–$26_n$, $28_1$–$28_n$ using a scatterometry tool 44.

In the illustrated embodiments, the controller 58 is a computer programmed with software to implement the functions described herein. Moreover, the functions described for the controller 58 may be performed by one or more controllers spread through the system. For example, the controller 58 may be a fab level controller that is used to control processing operations throughout all or a portion of a semiconductor manufacturing facility. Alternatively, the controller 58 may be a lower level computer that controls only portions or cells of the manufacturing facility. Moreover, the controller 58 may be a stand-alone device, or it may reside on the scatterometry tool 44.

Similar methodology may be employed with respect to the capacitance loading structures 30. That is, the capacitance loading structures 30 comprised of features 32, e.g., lines, that define a grating structure 34 that may be measured using the scatterometry tool 44 in a manner similar to that described earlier for the scatterometric measurements of the grating structures 22, 24. The critical dimension and/or profile of the features 32 that make up the grating structure 34 may be correlated with electrical test data for the ring oscillator 20. With this correlation established, the capacitance loading structure 30 may be measured after it is formed, and information as to the critical dimension and/or profile of features 32 comprising the grating structure 34 may be used in predicting the resulting electrical characteristics of the ring oscillator 20 and/or the completed integrated circuit device. The measurement of the capacitance loading structures 30 may be performed in conjunction with, or separate from, the measurement of the grating structures 22, 24 containing the gate electrode structures 26, 28, respectively. In combination, scatterometric measurement of the physical characteristics of the capacitance loading structures 30 and the gate electrode structures 26, 28 can provide more detailed information that may assist in predicting the electrical performance characteristics of the ring oscillator 20 and the completed device.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The present invention is generally directed to a scatterometry structure with an embedded ring oscillator, and various methods of using same. In one illustrative embodiment, the method comprises forming a ring oscillator that comprises a first grating structure comprised of a plurality of gate electrode structures for a plurality of N-channel transistors and a second grating structure comprised of a plurality of gate electrode structures for a plurality of P-channel transistors, and measuring the critical dimension and/or profile of at least one of the gate electrode structures in the first grating structure or the second grating structure using a scatterometry tool. In further embodiments, the method further comprises comparing the measured critical dimension and/or profile of the gate electrode structures to a model to predict at least one electrical performance characteristic of the ring oscillator, wherein the model provides a correlation between the critical dimension and/or profile of a gate electrode structure to at least one electrical performance characteristic of the ring oscillator. In turn, this may be used to predict the performance characteristics of the completed integrated circuit device.

In another embodiment, the method further comprises forming at least one capacitance loading structure, comprised of a plurality of features, as a portion of the ring oscillator, and measuring the critical dimension and/or profile of at least one of the features comprising the capacitance loading structure using a scatterometry tool. In further embodiments, the method further comprises comparing the measured critical dimension and/or profile of the feature to a model to predict at least one electrical performance characteristic of the ring oscillator, wherein the model provides a correlation between the critical dimension and/or profile of the features comprising the capacitance loading structure to at least one electrical performance characteristic of the ring oscillator.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a ring oscillator that comprises a first grating structure comprised of a plurality gate electrode structures for a plurality of N-channel transistors and a second grating structure comprised of a plurality of gate electrode structures for a plurality of P-channel transistors; and
   measuring at least one of a critical dimension and a profile of at least one of said gate electrode structures in at least one of said first grating structure and said second grating structure using a scatterometry tool.

2. The method of claim 1, wherein each of said gate electrode structures in said first grating structure are electrically coupled to a separate gate electrode structure comprising said second grating structure.

3. The method of claim 1, wherein measuring at least one of a critical dimension and a profile of at least one of said gate electrode structures in at least one of said first grating structure and said second grating structure using a scatterometry tool comprises illuminating at least one of said first and second grating structures and measuring light reflected off of said at least one of said first and second grating structures.

4. The method of claim 1, wherein said first grating structure is comprised of 101 gate electrode structures and wherein said second grating structure is comprised of 101 gate electrode structures.

5. The method of claim 1, further comprising comparing said measured at least one of a critical dimension and a profile of said at least one of said gate electrode structures to a model to predict at least one electrical performance characteristic of said ring oscillator.

6. The method of claim 5, wherein said at least one electrical performance characteristic is comprised of at least one of a drive current and an operating frequency of said ring oscillator.

7. The method of claim 1, further comprising comparing said measured at least one of a critical dimension and a profile of said at least one of said gate electrode structures to a model to predict at least one electrical performance characteristic of said ring oscillator, said model correlating at least one of a critical dimension and a profile of a gate electrode structure to at least one electrical performance characteristic of said ring oscillator.

8. The method of claim 1, further comprising:
   forming at least one capacitance loading structure comprised of a plurality of features, said at least one capacitance loading structure being a portion of said ring oscillator; and
   measuring at least one of a critical dimension and a profile of at least one of said features in said capacitance loading structure using a scatterometry tool.

9. The method of claim 8, further comprising comparing said measured at least one of a critical dimension and a profile of at least one of said features in said capacitance loading structure to a model to predict at least one electrical performance characteristic of said ring oscillator.

10. The method of claim 8, further comprising comparing said measured at least one of a critical dimension and a profile of said at least one of said features in said capacitance loading structure to a model to predict at least one electrical performance characteristic of said ring oscillator, said model correlating at least one of a critical dimension and a profile of a feature in said capacitance loading structure to at least one electrical performance characteristic of said ring oscillator.

11. The method of claim 10, wherein said at least one electrical performance characteristic is comprised of at least one of a drive current and an operating frequency of said ring oscillator.

12. The method of claim 8, wherein measuring at least one of a critical dimension and a profile of at least one of said features in said capacitance loading structure using a scatterometry tool comprises illuminating said features in said capacitance loading structure and measuring light reflected off of said features.

13. The method of claim 8, wherein said capacitance loading structure is comprised of a plurality of line-type features.

14. A method, comprising:
  forming a ring oscillator that comprises a first grating structure comprised of a plurality gate electrode structures for a plurality of N-channel transistors and a second grating structure comprised of a plurality of gate electrode structures for a plurality of P-channel transistors;
  measuring at least one of a critical dimension and a profile of at least one of said gate electrode structures in at least one of said first grating structure and said second grating structure using a scatterometry tool; and
  comparing said measured at least one of a critical dimension and a profile of said at least one of said gate electrode structures to a model to predict at least one electrical performance characteristic of said ring oscillator, said model correlating at least one of a critical dimension and a profile of a gate electrode structure to at least one electrical performance characteristic of said ring oscillator.

15. The method of claim 14, wherein each of said gate electrode structures in said first grating structure are electrically coupled to a separate gate electrode structure in said second grating structure.

16. The method of claim 14, wherein measuring at least one of a critical dimension and a profile of at least one of said gate electrode structures in at least one of said first grating structure and said second grating structure using a scatterometry tool comprises illuminating at least one of said first and second grating structures and measuring light reflected off of said at least one of said first and second grating structures.

17. The method of claim 14, wherein said first grating structure is comprised of 101 gate electrode structures and wherein said second grating structure is comprised of 101 gate electrode structures.

18. The method of claim 14, wherein said at least one electrical performance characteristic is comprised of at least one of a drive current and an operating frequency of said ring oscillator.

19. The method of claim 14, further comprising:
  forming at least one capacitance loading structure comprised of a plurality of features, said at least one capacitance loading structure being a portion of said ring oscillator; and
  measuring at least one of a critical dimension and a profile of at least one of said features in said capacitance loading structure using a scatterometry tool.

20. The method of claim 19, further comprising comparing said measured at least one of a critical dimension and a profile of at least one of said features in said capacitance loading structure to a model to predict at least one electrical performance characteristic of said ring oscillator.

21. The method of claim 20, wherein said at least one electrical performance characteristic is comprised of at least one of a drive current and an operating frequency of said ring oscillator.

22. The method of claim 19, further comprising comparing said measured at least one of a critical dimension and a profile of said at least one of said features in said capacitance loading structure to a model to predict at least one electrical performance characteristic of said ring oscillator, said model correlating at least one of a critical dimension and a profile of a feature in said capacitance loading structure to said at least one electrical performance characteristic of said ring oscillator.

23. The method of claim 19, wherein measuring at least one of a critical dimension and a profile of at least one of said features in said capacitance loading structure using a scatterometry tool comprises illuminating said features in said capacitance loading structure and measuring light reflected off of said features.

24. The method of claim 19, wherein said capacitance loading structure is comprised of a plurality of line-type features.

25. A method, comprising:
  forming a ring oscillator that comprises a first grating structure comprised of a plurality gate electrode structures for a plurality of N-channel transistors and a second grating structure comprised of a plurality of gate electrode structures for a plurality of P-channel transistors;
  measuring at least one of a critical dimension and a profile of at least one of said gate electrode structures in at least one of said first grating structure and said second grating structure using a scatterometry tool;
  forming at least one capacitance loading structure comprised of a plurality of features, said at least one capacitance loading structure being a portion of said ring oscillator; and
  measuring at least one of a critical dimension and a profile of at least one of said features in said capacitance loading structure using a scatterometry tool.

26. The method of claim 25, wherein each of said gate electrode structures in said first grating structure are electrically coupled to a separate gate electrode structure in said second grating structure.

27. The method of claim 25, wherein measuring at least one of a critical dimension and a profile of at least one of said gate electrode structures in at least one of said first grating structure and said second grating structure using a scatterometry tool comprises illuminating at least one of said first and second grating structures and measuring light reflected off of said at least one of said first and second grating structures.

28. The method of claim 25, wherein said first grating structure is comprised of 101 gate electrode structures and wherein said second grating structure is comprised of 101 gate electrode structures.

29. The method of claim 25, further comprising comparing said measured at least one of a critical dimension and a profile of said at least one of said gate electrode structures to a model to predict at least one electrical performance characteristic of said ring oscillator.

30. The method of claim 29, wherein said at least one electrical performance characteristic is comprised of at least one of a drive current and an operating frequency of said ring oscillator.

31. The method of claim 25, further comprising comparing said measured at least one of a critical dimension and a profile of said at least one of said gate electrode structures to a model to predict at least one electrical performance characteristic of said ring oscillator, said model correlating at least one of a critical dimension and a profile of a gate electrode structure to at least one electrical performance characteristic of said ring oscillator.

32. The method of claim 25, further comprising comparing said measured at least one of a critical dimension and a profile of at least one of said features in said capacitance loading structure to a model to predict at least one electrical performance characteristic of said ring oscillator.

33. The method of claim 25, further comprising comparing said measured at least one of a critical dimension and a profile of said at least one of said features in said capacitance loading structure to a model to predict at least one electrical performance characteristic of said ring oscillator, said model correlating at least one of a critical dimension and a profile of a feature comprising said capacitance loading structure to at least one electrical performance characteristic of said ring oscillator.

34. The method of claim 33, wherein said at least one electrical performance characteristic is comprised of at least one of a drive current and an operating frequency of said ring oscillator.

35. The method of claim 25, wherein measuring at least one of a critical dimension and a profile of at least one of said features in said capacitance loading structure using a scatterometry tool comprises illuminating said features in said capacitance loading structure and measuring light reflected off of said features.

36. The method of claim 25, wherein said capacitance loading structure is comprised of a plurality of line-type features.

37. A method, comprising:
   forming a ring oscillator that comprises a first grating structure comprised of a plurality gate electrode structures for a plurality of N-channel transistors and a second grating structure comprised of a plurality of gate electrode structures for a plurality of P-channel transistors;
   measuring at least one of a critical dimension and a profile of at least one of said gate electrode structures in at least one of said first grating structure and said second grating structure using a scatterometry tool;
   forming at least one capacitance loading structure comprised of a plurality of features, said at least one capacitance loading structure being a portion of said ring oscillator;
   measuring at least one of a critical dimension and a profile of at least one of said features in said capacitance loading structure using a scatterometry tool;
   comparing said measured at least one of a critical dimension and a profile of said at least one of said gate electrode structures to a model to predict at least one electrical performance characteristic of said ring oscillator; and
   comparing said measured at least one of a critical dimension and a profile of at least one of said features in said capacitance loading structure to a said model to predict at least one electrical performance characteristic of said ring oscillator.

38. The method of claim 37, wherein each of said gate electrode structures in said first grating structure are electrically coupled to a separate gate electrode structure in said second grating structure.

39. The method of claim 37, wherein measuring at least one of a critical dimension and a profile of at least one of said gate electrode structures in at least one of said first grating structure and said second grating structure using a scatterometry tool comprises illuminating at least one of said first and second grating structures and measuring light reflected off of at least one of said first and second grating structures.

40. The method of claim 37, wherein said first grating structure is comprised of 101 gate electrode structures and wherein said second grating structure is comprised of 101 gate electrode structures.

41. The method of claim 37, wherein said at least one electrical performance characteristic is comprised of at least one of a drive current and an operating frequency of said ring oscillator.

42. The method of claim 37, wherein said model provides a correlation between at least one of a critical dimension and a profile of a gate electrode structure to at least one electrical performance characteristic of said ring oscillator.

43. The method of claim 37, wherein said model further provides a correlation between at least one of a critical dimension and a profile of a feature comprising said capacitance loading structure to at least one electrical performance characteristic of said ring oscillator.

44. The method of claim 37, wherein measuring at least one of a critical dimension and a profile of at least one of said features in said capacitance loading structure a scatterometry tool comprises illuminating said features in said capacitance loading structure and measuring light reflected off of said features.

45. The method of claim 37, wherein said capacitance loading structure is comprised of a plurality of line-type features.

* * * * *

UNITED STATES PATENT AND TRADEMARK OFFICE
CERTIFICATE OF CORRECTION

PATENT NO. : 6,791,697 B1
DATED : September 14, 2004
INVENTOR(S) : Homi E. Nariman It is certified that error appears in the above-identified patent and that said Letters Patent is hereby corrected as shown below:

Column 14,
Line 36, after "structure" insert -- using --.

Signed and Sealed this

Fourth Day of January, 2005

JON W. DUDAS
*Director of the United States Patent and Trademark Office*